United States Patent [19]

Van Tuijl

[11] Patent Number: 4,952,866
[45] Date of Patent: Aug. 28, 1990

[54] VOLTAGE-TO-CURRENT CONVERTERS

[75] Inventor: Adrianus J. M. Van Tuijl, Nijmegen, Netherlands

[73] Assignee: U.S. Philips Corporation, New York, N.Y.

[21] Appl. No.: 392,634

[22] Filed: Aug. 11, 1989

[30] Foreign Application Priority Data

Aug. 19, 1988 [NL] Netherlands .................... 8802055

[51] Int. Cl.⁵ .............................................. G05F 3/20
[52] U.S. Cl. ...................................... 323/315; 323/312; 323/316; 307/261; 307/296.6
[58] Field of Search ....................... 323/312, 315, 316; 307/260, 261, 491, 296.1, 296.6, 296.8; 330/288

[56] References Cited

U.S. PATENT DOCUMENTS

| | | | |
|---|---|---|---|
| 3,825,774 | 7/1974 | Van Kessel et al. | 307/260 |
| 4,330,744 | 5/1982 | Embree et al. | 323/316 |
| 4,550,262 | 10/1985 | Kohsiek | 323/316 |
| 4,682,098 | 7/1987 | Seevinck et al. | 323/316 |

Primary Examiner—Peter S. Wong
Attorney, Agent, or Firm—Bernard Franzblau

[57] ABSTRACT

A voltage-to-current converter in which the base-emitter voltage of an output transistor (T1) is compensated by means of the base-emitter junction of a transistor (T2) so that the voltage across an impedance (Z1a) in series with the output transistor is equal to the input voltage (Vi). The current through the impedance (Z1a) is then equal to the output current Io, each of which is then linearly proportional to the input voltage (Vi).

23 Claims, 4 Drawing Sheets

VOLTAGE-TO-CURRENT CONVERTERS

BACKGROUND OF THE INVENTION

This invention relates to a voltage-to-current converter comprising an input for receiving an input signal, a first transistor of a first conductivity type having a collector coupled to an output for supplying an output signal, an emitter coupled to a first impedance, and a base coupled to the input via the emitter-base junction of a second transistor of a second conductivity type. The second transistor has its collector coupled to a first power-supply terminal and the base of said first transistor also is coupled to a second power-supply terminal via the collector-emitter path of a third transistor of the second conductivity type. The base of the third transistor is coupled both to the second power-supply terminal via the emitter-base junction of a diode-connected fourth transistor and to a second impedance via the collector-emitter path of a fifth transistor of the first conductivity type. The invention also relates to a balanced voltage-to-current converter comprising a pair of identical voltage-to-current converters.

Such a voltage-to-current converter is known from U.S. Pat. No. 4,330,744 and in principle operates in the same way as the well-known emitter-follower arrangement, the current in the collector instead of the voltage on the emitter of the first transistor being taken as the output signal.

An emitter-follower arrangement has the drawback that the output current increases as a non-linear function of the input voltage because the base-emitter voltage of the first transistor varies as the input voltage increases.

The influence of the base-emitter voltage of the first transistor in the known voltage-to-current converter is compensated for by coupling the base of the first transistor to the input via the emitter-base junction of the second transistor of opposite conductivity type. The base-emitter voltages of the first transistor and the second transistor are equalised indirectly by means of a compensation circuit comprising the third and the fourth transistor, which are of the same conductivity type and which are arranged as a current mirror, and the fifth transistor, which is identical to the first transistor and which has its emitter coupled to an impedance equal to that to which the emitter of the first transistor is coupled. The current mirror keeps the collector current of the fifth transistor equal to the emitter current of the second transistor so that the base-emitter voltages of the second and the fifth transistor, and hence those of the second and the first transistor are approximately equal to each other. This known compensation circuit only operates with the desired accuracy if the current mirror ratio is unity and if the second and the fifth transistor have equal saturation currents. Since the second and the fifth transistors are of opposite conductivity types, equal saturation currents are difficult to realize in practice.

SUMMARY OF THE INVENTION

It is an object of the invention to provide a voltage-to-current converter which does not have said drawbacks.

To this end a voltage-to-current converter of the type defined in the opening paragraph is characterized in that the fourth transistor is of the first conductivity type and in that the fifth transistor has its base coupled both to the input via the emitter-base junction of a sixth transistor of the second conductivity type, and to the second power-supply terminal via a first current source, said sixth transistor having its collector coupled to the first power-supply terminal.

In this circuit base-emitter voltage compensation is achieved in that the base-emitter voltage of the second transistor is made equal to the base-emitter voltage of the fifth transistor by means of the parallel connected base-emitter junctions of the third and the fourth transistor, said fifth transistor being driven by the input signal via the sixth transistor in a way substantially similar to the first transistor. The voltage across the first impedance, which voltage dictates the output current, is now substantially equal to the input voltage, so that the output current is independent of the base-emitter voltage of the first transistor. An accurate one-to-one current mirror and transistors of opposite conductivity types and having equal saturation currents are now not necessary.

The absolute value of and the variation in the current through the second and the third transistor in the case of a varying input signal can be controlled more effectively if the voltage-to-current converter is characterized further in that the emitter of the second transistor is coupled to the base of the first transistor via a first resistor and the emitter of the third transistor is coupled to the second power supply terminal via a second resistor of substantially the same value as the first resistor. Arranging identical first and second resistors in series with the emitter of the second and the third transistor reduces the dependence of the current through these transistors upon the base-emitter voltages of these transistors and the spread in these voltages. The accuracy of the emitter-base compensation of the first transistor is improved if the voltage-to-current converter is characterized further in that the base of the fifth transistor is coupled to the emitter of the sixth transistor via a third resistor, and in that the first current source comprises a series arrangement of a fourth resistor of substantially the same value as the third resistor and the emitter-collector path of a seventh transistor of the second conductivity type, which series arrangement is connected between the second power-supply terminal and the base of the fifth transistor, said seventh transistor having its base coupled both to the second power-supply terminal via the base-emitter junction of a diode-connected eighth transistor of the first conductivity type and to a current-supplying element. The current in the sixth transistor is now a closer approximation to the average value of the current in the second transistor, so that the currents through the fifth and the first transistor are also more accurately equal to each other. The accuracy can be improved even further if the current-supplying element comprises a series arrangement of a third impedance and the collector-emitter path of a ninth transistor of the first conductivity type, which ninth transistor has its base coupled both to the second power supply terminal via a second current source and to the input via the emitter-base junction of a tenth transistor of the second conductivity type, which tenth transistor has its collector coupled to the first power-supply terminal. The current-supplying element is replaced by a simple voltage-to-current converter whose output current increases as a substantially linear function of the input voltage.

A balanced voltage-to-current converter is obtained by arranging a pair of identical voltage-to-current converters in such a way that the first and the second impedance of one converter of the pair are respectively coupled to the first and the second impedance of the other converter of the pair, and in that the emitters of the first transistors are each coupled to the first power supply terminal via a first bias current source and the emitters of the fifth transistors are each coupled to said first power supply terminal via a second bias current source. This balanced converter has two inputs and two outputs, enabling it to be driven with a floating input voltage. The power dissipation and the input offset voltage of this balanced voltage-to-current converter can be reduced by adapting the bias current sources to the instantaneous values of the required output currents. For this purpose the balanced voltage-to-current converter may be characterized further in that the first and the second bias current sources are controlled by a comparator which has a first input coupled to a reference voltage point and which has a second input coupled to an output of a selection circuit for supplying a signal voltage which is proportional to the smaller one of the currents through the fourth transistors of the pair. The comparator makes the output voltage of the selection circuit equal to the reference voltage by controlling the first and the second bias current sources. Thus, the smaller of the currents through the two fourth transistors is maintained equal to a reference value. By adapting this reference value to the bias current needed for zero input signal, the minimum value of the current through the bias current sources can be reduced substantially because it is no longer necessary to allow for the maximum output current.

BRIEF DESCRIPTION OF THE DRAWINGS

Embodiments of the invention will now be described in more detail, by way of example, with reference to the accompanying drawings in which.

DESCRIPTION OF THE PREFERRED EMBODIMENTS

Figure 1A:
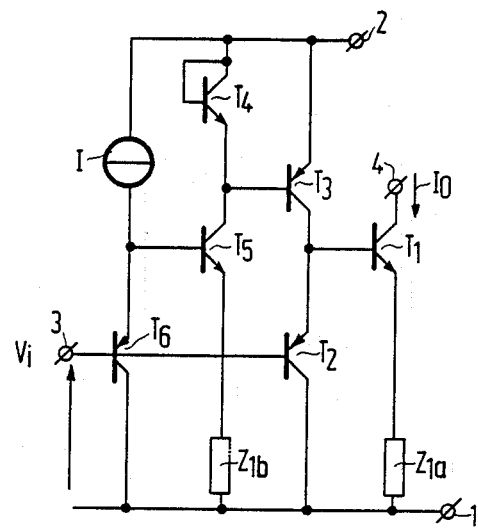
FIGS. 1a and 1b show two embodiments of a basic voltage-to-current converter arrangement in accordance with the invention.
Figure 1B:
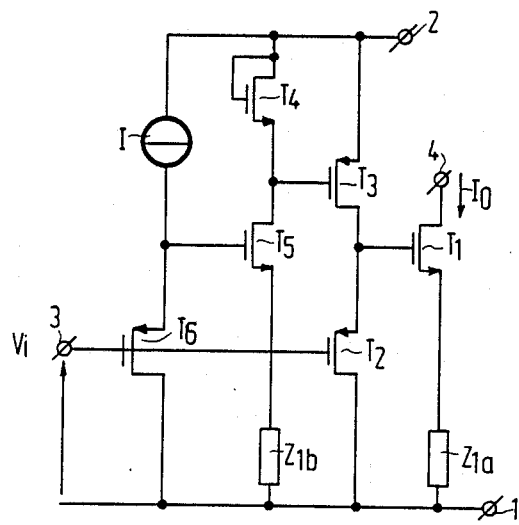

FIG. 1 shows two embodiments of a basic voltage-to-current converter arrangement in accordance with the invention. The arrangement shown in FIG. 1a employs bipolar transistors and the arrangement shown in FIG. 1b uses unipolar transistors. Hereinafter the invention will be described for embodiments employing bipolar transistors. However, the operation of the embodiments comprising unipolar transistors is identical to the corresponding embodiments employing bipolar transistors and can be understood by reading "gate", "source" and "drain" for "base", "emitter" and "collector".

FIG. 1a shows the basic arrangement of the voltage-to-current converter. An input voltage Vi to be converted into an output current Io by the converter is applied to the input terminal 3, the output current being available on the output terminal 4. Actual voltage-to-current conversion is effected in the NPN transistor T1. This transistor has its emitter connected to the negative power supply terminal 1 via an impedance Z1a and its collector to the output 4. The base of the transistor T1 is coupled to the emitter of an emitter follower PNP transistor T2 having its collector connected to the negative power supply terminal 1 and its base to the input 3. The emitter of the transistor T2 is also coupled to the collector of a PNP transistor T3 arranged as a current source and having its emitter coupled to the positive power supply terminal 2. The base of the transistor T3 is connected to the emitter of a diode-connected NPN transistor T4, whose collector and base are connected to the positive power supply terminal 2, and is also connected to the collector of the NPN transistor T5. The emitter of the transistor T5 is connected to the negative power supply terminal 1 via an impedance Z1b of substantially the same value as Z1a. The base of the transistor T5 is coupled to the emitter of the emitter follower PNP transistor T6 and to a current source I, which is connected to the positive power supply terminal 2. The collector of the transistor T6 is connected to the negative power supply terminal 1 and the base of the transistor T6 is connected to the input terminal 3.

The input signal Vi is applied to the base of the transistor T1 via the emitter follower T2. If the base-emitter voltage drop of the transistor T1 is compensated for by the base-emitter voltage drop of the transistor T2, the voltage across the impedance Z1a will be substantially equal to the input voltage Vi, so that the collector current of the transistor T1 increases as a substantially linear function of the input voltage Vi. The transistors T1 and T2 are of opposite conductivity types and generally have unequal base-emitter voltages, inter alia because the currents in the transistors T1 and T2 are not equal. The circuit comprising the transistors T3, T4, T5 and T6 ensures that the base-emitter voltages of the transistors T1 and T2 are equalised to an optimum extent. The NPN transistors T1, T4 and T5 are identical to one another and the PNP transistors T2, T3 and T6 are identical to each other. The transistor combination T5, T6 is a replica of the transistor combination T1, T2. Therefore the current flowing in the transistor T5 as a result of a varying input voltage Vi will be substantially equal to the current through the transistor T1, so that the base-emitter voltages of T5 and T1 will also be substantially equal to each other. The collector current of the transistor T5 flows through the diode connected transistor T4, so that the base-emitter voltages of the transistors T4 and T5 are equal to each other. Since the base-emitter junction of the transistor T3 is arranged in parallel with that of the transistor T4 the base-emitter voltages of the transistors T3 and T4 are equal to each other. Substantially the entire current through the transistor T3 flows in the transistor T2, so that the base-emitter voltage of the transistor T2 is equal to that of the transistor T3. This results in the base-emitter voltages of the transistors T5 and T2 being equal to each other and those of T1 and T2 are also equal to each other. The voltage on the emitter of the transistor T1 is therefore substantially equal to the input voltage Vi, so that the output current complies with: Io=Vi/Z1a.

The transistors T4 and T3 operate as a current mirror, the current through the PNP transistors T3 and T2 being subject to fluctuations as a result of the difference in construction between a PNP and an NPN transistor.

Figure 2:
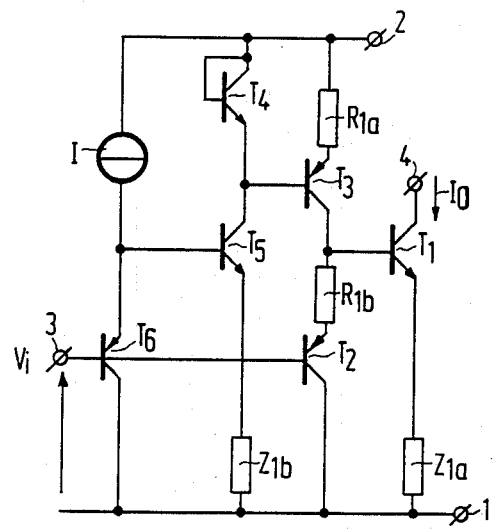
FIGS. 2, 3 and 4 show further embodiments of a basic voltage-to-current converter arrangement in accordance with the invention.

The influence of the base-emitter voltage of the transistors T2 and T3 on said current is reduced by arranging identical resistors in series with the emitters of the transistors T2 and T3. FIG. 2 shows such an embodiment in which these resistors bear the references R1a and R1b. The other reference numerals have the same meaning as in FIG. 1.

The compensation for the base-emitter voltage of the transistor T1 is achieved indirectly by making the base-emitter voltage of the transistor T2 equal to the base-emitter voltage of the transistor T5, which transistor is identical to and is driven in substantially the same way an the transistor T1. The compensation can be improved when the current in the transistor T6, which drives the transistor T5, and the current in the transistor T2, which drives the transistor T1, are equalised to an optimum extent.

Figure 3:
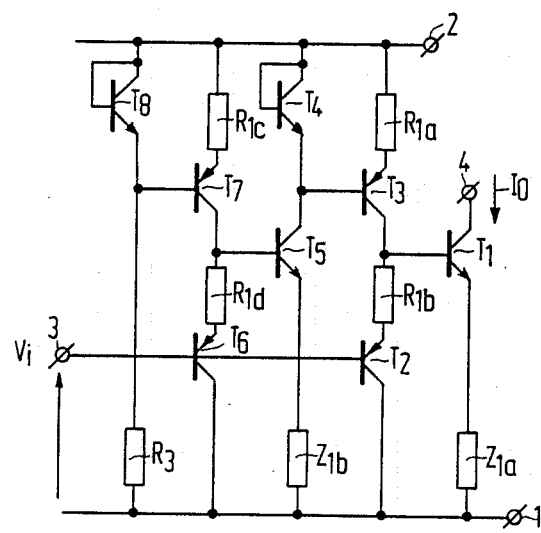

FIG. 3 shows an embodiment in which for this purpose the current source I of the arrangement shown in FIG. 2 is replaced by a PNP transistor T7 which is arranged as a current source and which has its collector coupled to the emitter of the transistor T6 via the resistor R1d and to the base of the transistor T5, and which has its emitter coupled to the positive power supply terminal 2 via the resistor R1c. The current through the transistor T7 is determined by the diodeconnected NPN transistor T8, whose collector and base are connected to the positive power supply terminal 2 and whose emitter is connected to the base of the transistor T7 and, via a current determining resistor R3, to the negative power supply terminal 1. The resistors R1c and R1d are equal to the resistors R1a and R1b and have the same function, but may be dispensed with if desired. The transistors T7 and T8 are identical to the transistors T3 and T4 respectively and also constitute a current mirror. The resistor R3 is dimensioned in such a way that the current through the current source transistor T7 and hence that through the transistor T6 as accurately as possible corresponds to the average current through the transistor T2.

Figure 4:
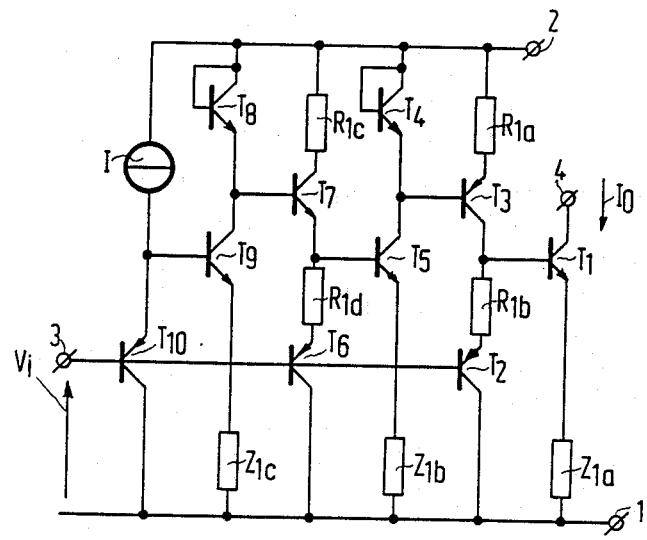

By replacing the resistor R3 by a simple voltage-to-current converter whose output current is substantially proportional to the input voltage the mutual equality of the currents through the transistors T6 and T2 is approximated even more closely. FIG. 4 shows an embodiment in which the resistor R3 of the arrangement of FIG. 3 is replaced by an NPN transistor T9 which functions as a voltage-to-current converter, which has its collector connected to the emitter of the transistor T8 and to the base of the transistor T7 and which has its emitter connected to the negative power supply terminal 1 via an impedance Z1c which is substantially equal to Z1a. The base of the transistor T9 is connected to the emitter of the emitter-follower PNP transistor T10 whose collector is connected to the negative power supply terminal 1 and whose base is connected to the input terminal 3. The transistor T10 is biased with a current source I arranged between the emitter of the transistor T10 and the positive power-supply terminal 2. The transistors T9 and T10 are identical to the transistors T1 and T2 respectively. The collector current of the transistor T9 is more closely proportional to the input voltage Vi than the constant current supplied to the current mirror T8, T7 by the resistor R3 in the arrangement shown in FIG. 3. The current produced in the transistor T6 as a result of a varying input voltage Vi is now a more accurate replica of the current in the transistor T2.

In all of the embodiments it is possible to scale the emitter areas, the resistors and the impedances of corresponding components in the various stages in an appropriate manner. The compensation circuit can then operate at a lower current level than the output transistor T1. This reduces the dissipation of the arrangement and it reduces the chip area.

Each of the embodiments shown in FIGS. 1 to 4 can be used to construct a balanced voltage-to-current converter.

Figure 5A:
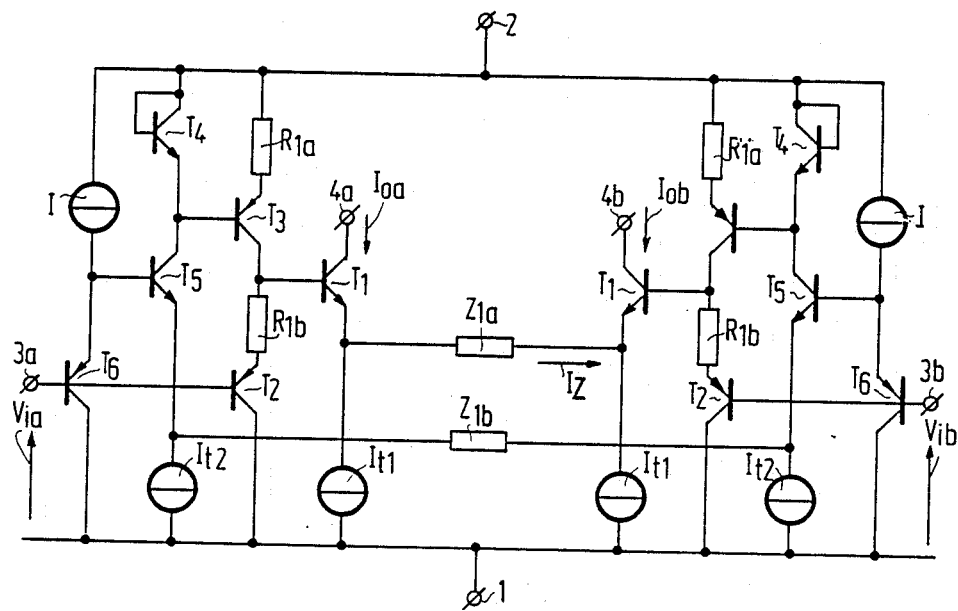
FIGS. 5a and 5b show two embodiments of a balanced voltage-to-current converter in accordance with the invention.
Figure 5B:
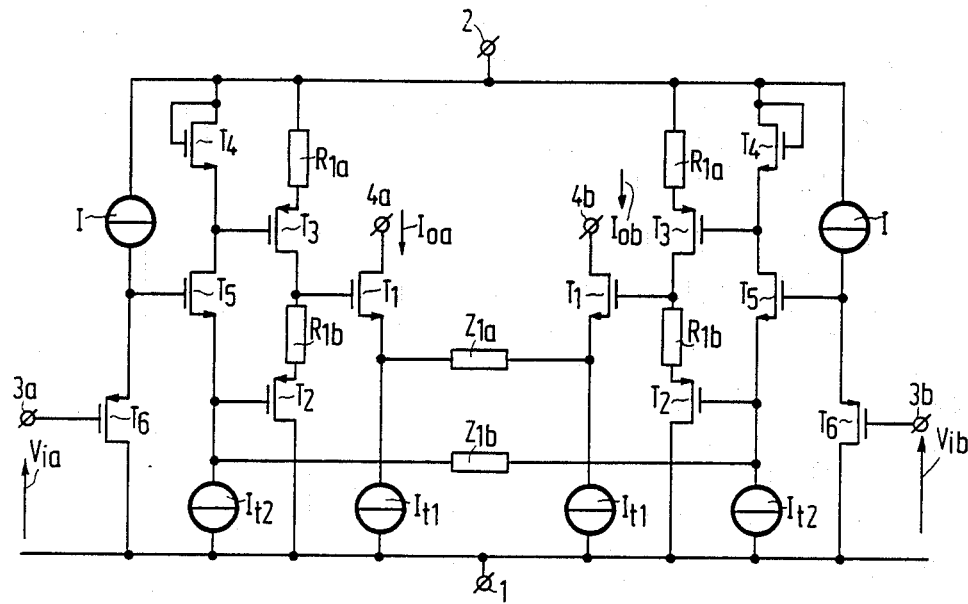

FIG. 5 by way of example shows two balanced versions of the arrangement shown in FIG. 2. FIG. 5a shows a version comprising bipolar transistors and FIG. 5b shows the same arrangement comprising unipolar transistors. The balanced versions of the voltage-to-current converter will be described only for the bipolar versions. The operation of the unipolar versions is identical and can be understood by reading "gate", "source" and "drain", for "base", "emitter" and "collector".

FIG. 5a shows an embodiment of a balanced voltage-to-current converter in accordance with the invention. It comprises two voltage-to-current converters as shown in FIG. 2. The impedance Z1a is now arranged between the emitters of the transistors T1 and the impedance Z1b between the emitters of the transistors T5. For the d.c. setting bias current sources It1 are arranged in the emitter lines of the transistors T1 and bias current sources It2 are arranged in the emitter lines of the transistors T5. The arrangement has two inputs 3a and 3b to which the voltages Via and Vib are applied respectively and two outputs 4a and 4b in which the outputs currents Ioa and Iob flow respectively. The other reference numerals have the same meaning as in FIG. 2. The signal current Iz through the impedance Z1a is determined by the difference between the input voltages on the input terminals 3a and 3b. Iz=(Via−Vib)/Z1a. This signal current Iz appears on the output terminals 4a and 4b as two opposite currents. The bias current It1 also flows in each these output terminals in the same direction, so that Ioa=It1+Iz and Iob=It1−Iz.

The bias current sources It1 and It2 are suitably dimensioned in conformity with the largest signal current Iz anticipated as a result of a varying signal voltage. Indeed, if the instantaneous value of Iz becomes larger than the current It1, one of the two output currents tends to reverse in an absolute sence, which is not possible. There will then be no current in the relevant output transistor T1, causing this transistor to be turned off. However, the bias currents It1 and It2 may be reduced to provide a bias which is adequate only for small signal currents Iz, provided that the bias currents are constantly adapted to the instantaneous value of the smaller of the output currents Ioa and Iob. The advantages of such an adaptive bias are a reduced current consumption of the entire arrangement and a reduced offset voltage on the inputs 3a and 3b.

Figure 6:
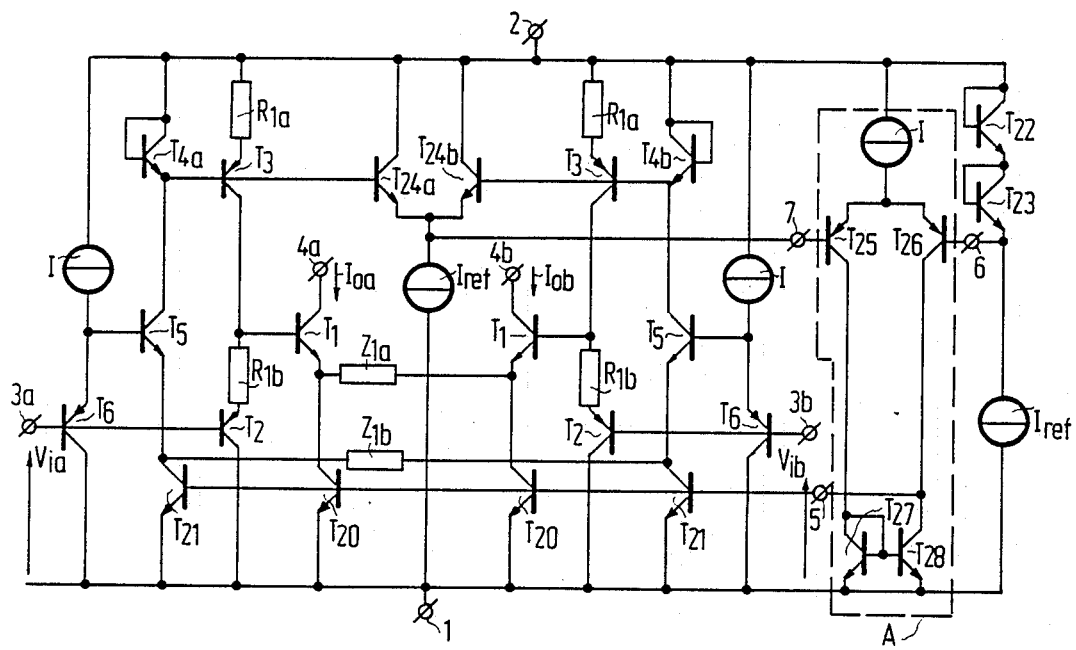
FIG. 6 shows a further embodiment of a balanced voltage-to-current converter as shown in FIG. 5 comprising signal-controlled bias current sources.

FIG. 6 shows an embodiment of a balanced voltage-to-current converter with adaptive bias in accordance with the invention. The arrangement is derived from that shown in FIG. 5a and corresponding reference numerals have the same meaning. It1 and It2 are replaced by NPN transistors T20 and T21 respectively, whose emitters are all connected to the negative power-supply terminal 1 and whose collectors are connected to the emitters of the transistors T1 and T5 respectively. The bases of the transistors T20 and T21 are all coupled to the output 5 of the comparator A. One input 6 of the comparator is connected to a reference voltage equal to the voltage drop produced across the series arrangement of two diode connected NPN transistors T22 and T23 by a current source Iref. The other input 7 of the comparator is connected to the emitters of two NPN transistors T24a and T24b which are arranged as a differential pair and whose commoned emitters are connected to the negative power-supply terminal 1 via a second current source Iref. The collectors of the transistors T24a and T24b are connected to the positive power supply terminal 2. The bases of the transistors T24a and T24b are connected to the emitters of the diode connected transistors T4, which are referred to as T4a and T4b to distinguish between them.

If the instantaneous value of the output current Ioa is greater than the instantaneous value of the output current Iob, the voltage drop across the diode T4a will also be larger than that across the diode T4b, because the currents through the diodes T4a and T4b are proportional to the currents Ioa and Iob, respectively. The voltage on the base of the transistor T24a is then lower than that on the base of the transistor T24b, so that the transistor T24b conducts and the transistor T24a is cut off. The voltage on the commoned emitters is then proportional to the voltage drop across the diode T4b. As soon as the instantaneous value of the output current Ioa becomes smaller than that of Iob, the transistor T24a conducts and the transistor T24b is cut off, the voltage on the commoned emitters then being proportional to the voltage drop across the diode T4a. The transistor pair T24a, T24b constitutes a selection circuit whose output voltage on the commoned emitters is proportional to the smaller of the output currents Ioa and Iob. The comparator A compares this output voltage with the reference voltage and controls the current source transistors T20 and T21 in such a way that the voltage difference between the reference voltage on the input 6 and the output voltage of the selection circuit on input 7 has become zero. If the transistors T4a, T4b, T24a, T24b, T22 and T23 are all identical, the voltage drop across the series arrangement of the transistors T22 and T23 will be equal to that across the series arrangement of the transistors T4a and T24a, or T4b and T24b. Since the current Iref flows through T22, T23, T24a and T24b the current Iref will also flow through T4a or T4b. The instantaneous value of the smaller of the currents through the diodes T4a and T4b and the associated transistors T4 and T1 is thus maintained at the value Iref. However, any desired current ratio can be obtained by an appropriate scaling.

In the present embodiment the comparator A comprises an emitter-coupled PNP transistor pair T25 and T26, whose common emitter line is coupled to the positive power supply terminal 2 via a current source and whose bases are connected to the inputs 6 and 7. The collector of the transistor T25 is connected to the collector and the base of a diode connected NPN transistor T27, whose emitter is connected to the negative power-supply terminal 1. The base and the emitter of the transistor T27 are respectively connected to the base and the emitter of an NPN transistor T28 which together with the transistor T27 constitutes a current mirror. The collector of the transistor T28 is connected to the collector of the transistor T26 and to the output of the comparator A.

However, for the comparator other configurations than that shown in FIG. 6 may be used.

The invention is not limited to the embodiments shown herein. In the embodiments comprising bipolar transistors the NPN and PNP transistors may be interchanged and in the embodiments comprising unipolar transistors the NMOS and PMOS transistors may be interchanged.

I claim:
1. A voltage-to-current converter comprising; an input for receiving an input signal, a first transistor of a first conductivity type having a collector coupled to an output for supplying an output signal, an emitter coupled to a first impedance, and a base coupled to the input via the emitter-base junction of a second transistor of a second conductivity type, which second transistor has its collector coupled to a first power-supply terminal, the base of said first transistor also being coupled to a second power-supply terminal via the collector-emitter path of a third transistor of the second conductivity type, the base of the third transistor being coupled both to the second power-supply terminal via the emitter-base junction of a diode-connected fourth transistor and to a second impedance via the collector-emitter path of a fifth transistor of the first conductivity type, characterized in that the fourth transistor is of the first conductivity type and in that the fifth transistor has its base coupled both to the input via the emitter-base junction of a sixth transistor of the second conductivity type, and to the second power-supply terminal via a first current source, said sixth transistor having its collector coupled to the first power-supply terminal.

2. A voltage-to-current converter as claimed in claim 1, wherein the emitter of the second transistor is coupled to the base of the first transistor via a first resistor and the emitter of the third transistor is coupled to the second power-supply terminal via a second resistor of substantially the same value as the first resistor.

3. A voltage-to-current converter as claimed in claim 1 or 2, wherein the base of the fifth transistor is coupled to the emitter of the sixth transistor and in that the first current source comprises the emitter-collector path of a seventh transistor of the second conductivity type, which emitter-collector path is coupled between the second power-supply terminal and the base of the fifth transistor, said seventh transistor having its base coupled to the second power-supply terminal via the base-emitter junction of a diode-connected eighth transistor of the first conductivity type and to a current-supplying element.

4. A voltage-to-current converter as claimed in claim 1 or 2, wherein the base of the fifth transistor is coupled to the emitter of the sixth transistor via a third resistor, and the first current source comprises a series arrangement of a fourth resistor of substantially the same value as the third resistor and the emitter-collector path of a seventh transistor of the second conductivity type, which series arrangement is connected between the second power supply terminal and the base of the fifth transistor, said seventh transistor having its base coupled both to the second power-supply terminal via the base-emitter junction of a diode-connected eighth transistor of the first conductivity type and to a current-supplying element.

5. A voltage-to-current converter as claimed in claim 3 wherein the current-supplying element comprises a series arrangement of a third impedance and the collector-emitter path of a ninth transistor of the first conductivity type, which ninth transistor has its base coupled both to the second power-supply terminal via a second current source and to the input via the emitter-base junction of a tenth transistor of the second conductivity type, which tenth transistor has its collector coupled to the first power supply terminal.

6. A voltage-to-current converter as claimed in claim 5, wherein the third impedance is coupled to the first power supply terminal.

7. A voltage-to-current converter as claimed in claim 1, 2 wherein the first and the second impedance are coupled to the first power supply terminal.

8. A balanced voltage-to-current converter, comprising a pair of identical voltage-to-current converters as claimed in claim 1, or 2 wherein the first and the second impedance of one converter of the pair are respectively coupled to the first and second impedance of the other converter of the pair, and in that the emitters of the first transistors are each coupled to the first power supply terminal via a first bias current source and the emitters of the fifth transistors are each coupled to said first power-supply terminal via a second bias current source.

9. A balanced voltage-to-current converter, comprising a pair of identical voltage-to-current converters as claimed in claim 5, wherein the first, the second and the third impedance of one converter of the pair are respectively coupled to the first, the second and the third impedance of the other converter of the pair, and in that the first transistors are each coupled to the first power-supply terminal via a first bias-current source, the fifth transistors are each coupled to said first power-supply terminal via a second bias-current source, and the ninth transistors are each coupled to said first power-supply terminal via a third bias-current source.

10. A balanced voltage-to-current converter as claimed in claim 8, wherein the first and the second bias-current sources are controlled by a comparator which has a first input coupled to a reference-voltage point and which has a second input coupled to an output of a selection circuit for supplying a signal voltage which is proportional to the smaller one of the currents through the fourth transistors of the pair.

11. A balanced voltage-to-current converter as claimed in claim 9, wherein the first, the second and the third bias-current sources are controlled by a comparator having a first input coupled to a reference voltage point and having a second input coupled to an output of a selection circuit for supplying a signal voltage which is proportional to the smaller one of the currents through the fourth transistors of the pair.

12. A balanced voltage-to-current converter as claimed in claim 10, wherein the reference voltage point is coupled to the first power-supply terminal via a third current source and to the second power-supply terminal via a series arrangement of two diode connected transistors of the first conductivity type.

13. A balanced voltage-to-current converter as claimed in claim 10 wherein the selection circuit comprises two transistors of the first conductivity type, which two transistors have their collectors coupled to the second power-supply terminal and have their emitters coupled to each other, to the first power-supply terminal via a further current source, and to the output of the selection circuit, one of said two transistors having its base coupled to the emitter of the fourth transistor of one voltage-to-current converter of the pair and the other of said two transistors having its base coupled to the emitter of the fourth transistor of the other voltage-to-current converter of the pair.

14. A voltage-to-current converter as claimed in claim 1, or 2 wherein the bipolar transistors are replaced by unipolar transistors.

15. A balanced voltage-to-current converter as claimed in claim 8, wherein the bipolar transistors are replaced by unipolar transistors.

16. A voltage-to-current converter as claimed in claim 3 wherein the first and the second impedance are coupled to the first power supply terminal.

17. A voltage-to-current converter as claimed in claim 5 wherein the first and the second impedance are coupled to the first power supply terminal.

18. A balanced voltage-to-current converter, comprising a pair of identical voltage-to-current converters as claimed in claim 3 wherein the first and the second impedance of one converter of the pair are respectively coupled to the first and second impedance of the other converter of the pair, and the emitters of the first transistors are each coupled to the first power supply terminal via a first bias current source and the emitters of the fifth transistors are each coupled to said first power-supply terminal via a second bias current source.

19. A balanced voltage-to-current converter as claimed in claim 18, wherein the first and the second bias-current sources are controlled by a comparator which has a first input coupled to a reference-voltage point and which has a second input coupled to an output of a selection circuit for supplying a signal voltage which is proportional to the smaller one of the currents through the fourth transistors of the pair.

20. A balanced voltage-to-current converter as claimed in claim 19, wherein the reference voltage point is coupled to the first power-supply terminal via a third current source and to the second power-supply terminal via a series arrangement of two diode connected transistors of the first conductivity type.

21. A balanced voltage-to-current converter as claimed in claim 19, wherein the selection circuit comprises two transistors of the first conductivity type, which two transistors have their collectors coupled to the second power-supply terminal and have their emitters coupled to each other, to the first power-supply terminal via a further current source, and to the output of the selection circuit, one of said two transistors having its base coupled to the emitter of the fourth transistor of one voltage-to-current converter of the pair and the other of said two transistors having its base coupled to the emitter of the fourth transistor of the other voltage-to-current converter of the pair.

22. A voltage-to-current converter as claimed in claim 3, wherein the bipolar transistors are replaced by unipolar transistors.

23. A balanced voltage-to-current converter as claimed in claim 10, wherein the bipolar transistors are replaced by unipolar transistors.

* * * * *